United States Patent
Wan et al.

(10) Patent No.: US 9,423,473 B2
(45) Date of Patent: Aug. 23, 2016

(54) THREE AXIS MAGNETIC SENSOR DEVICE AND METHOD USING FLEX CABLES

(71) Applicant: mCube Inc., San Jose, CA (US)

(72) Inventors: Hong Wan, Plymouth, MN (US); Anthony F. Flannery, Los Gatos, CA (US)

(73) Assignee: MCUBE INC., San Jose, CA (US)

(*) Notice: Subject to any disclaimer, the term of this patent is extended or adjusted under 35 U.S.C. 154(b) by 0 days.

(21) Appl. No.: 14/606,909

(22) Filed: Jan. 27, 2015

(65) Prior Publication Data

US 2015/0137806 A1   May 21, 2015

Related U.S. Application Data

(62) Division of application No. 13/211,305, filed on Aug. 17, 2011, now Pat. No. 8,969,101.

(51) Int. Cl.
*G01R 33/09* (2006.01)
*G01R 33/02* (2006.01)

(52) U.S. Cl.
CPC .......... *G01R 33/093* (2013.01); *G01R 33/0206* (2013.01); *G01R 33/096* (2013.01); *G01R 33/098* (2013.01)

(58) Field of Classification Search
CPC ............... G01R 33/093; G01R 33/098; G01R 33/0206; G01R 33/0052; G01R 33/0286
See application file for complete search history.

(56) References Cited

U.S. PATENT DOCUMENTS

| | | | |
|---|---|---|---|
| 3,614,677 A | 10/1971 | Wilfinger | |
| 8,181,874 B1 | 5/2012 | Wan et al. | |
| 8,227,285 B1 | 7/2012 | Yang | |
| 8,236,577 B1 | 8/2012 | Hsu et al. | |
| 8,245,923 B1 | 8/2012 | Merrill et al. | |
| 8,324,047 B1 | 12/2012 | Yang | |
| 8,367,522 B1 | 2/2013 | Yang | |
| 8,395,252 B1 | 3/2013 | Yang | |
| 8,402,666 B1 | 3/2013 | Hsu et al. | |
| 8,407,905 B1 | 4/2013 | Hsu et al. | |
| 8,421,082 B1 | 4/2013 | Yang | |
| 8,432,005 B2 | 4/2013 | Yang | |
| 8,476,084 B1 | 7/2013 | Yang et al. | |
| 8,476,129 B1 | 7/2013 | Jensen et al. | |
| 8,477,473 B1 | 7/2013 | Koury et al. | |

(Continued)

OTHER PUBLICATIONS

Notice of Allowance for U.S. Appl. No. 13/211,305 dated Oct. 22, 2014, 9 pages.

(Continued)

*Primary Examiner* — Minh-Loan Tran
*Assistant Examiner* — Leslie Pilar Cruz
(74) *Attorney, Agent, or Firm* — Kilpatrick Townsend & Stockton LLP

(57) ABSTRACT

A method and structure for a three-axis magnetic field sensing device. An IC layer having first bond pads and second bond pads can be formed overlying a substrate/SOI member with a first, second, and third magnetic sensing element coupled the IC layer. One or more conductive cables can be formed to couple the first and second bond pads of the IC layer. A portion of the substrate member and IC layer can be removed to separate the first and second magnetic sensing elements on a first substrate member from the third sensing element on a second substrate member, and the third sensing element can be coupled to the side-wall of the first substrate member.

18 Claims, 15 Drawing Sheets

(56) References Cited

U.S. PATENT DOCUMENTS

| | | |
|---|---|---|
| 8,486,723 B1 | 7/2013 | Wan |
| 8,553,389 B1 | 10/2013 | Koury et al. |
| 8,584,521 B1 | 11/2013 | Yang |
| 8,592,993 B2 | 11/2013 | Yang |
| 8,637,943 B1 | 1/2014 | Yang |
| 8,643,612 B2 | 2/2014 | Yang |
| 8,652,961 B1 | 2/2014 | Yang |
| 8,723,986 B1 | 5/2014 | Merrill |
| 8,742,520 B2 | 6/2014 | Wan et al. |
| 8,749,004 B2 | 6/2014 | Yang |
| 8,794,065 B1 | 8/2014 | Yang |
| 8,797,279 B2 | 8/2014 | Yang |
| 8,823,007 B2 | 9/2014 | Yang |
| 8,869,616 B1 | 10/2014 | Sridharamurthy et al. |
| 8,928,602 B1 | 1/2015 | Wan |
| 8,928,696 B1 | 1/2015 | Yang |
| 8,936,959 B1 | 1/2015 | Yang |
| 8,969,101 B1 | 3/2015 | Wan |
| 8,981,560 B2 | 3/2015 | Jensen et al. |
| 8,993,362 B1 | 3/2015 | Flannery |
| 9,150,406 B2 | 10/2015 | Yang |
| 2004/0227201 A1 | 11/2004 | Borwick et al. |
| 2005/0252293 A1 | 11/2005 | Won et al. |
| 2005/0270020 A1 * | 12/2005 | Peczalski ............... B82Y 25/00 324/247 |
| 2006/0049826 A1 | 3/2006 | Daneman et al. |
| 2007/0181962 A1 | 8/2007 | Partridge et al. |
| 2007/0281379 A1 | 12/2007 | Stark et al. |
| 2008/0014682 A1 | 1/2008 | Yang et al. |
| 2008/0316654 A1 | 12/2008 | Aiso |
| 2010/0083756 A1 | 4/2010 | Merz et al. |
| 2010/0236327 A1 | 9/2010 | Mao |
| 2011/0154905 A1 | 6/2011 | Hsu et al. |
| 2011/0244599 A1 | 10/2011 | Whig |
| 2015/0137806 A1 | 5/2015 | Wan et al. |

OTHER PUBLICATIONS

Office Action for U.S. Appl. No. 13/211,305 dated Feb. 20, 2014, 17 pages.

* cited by examiner

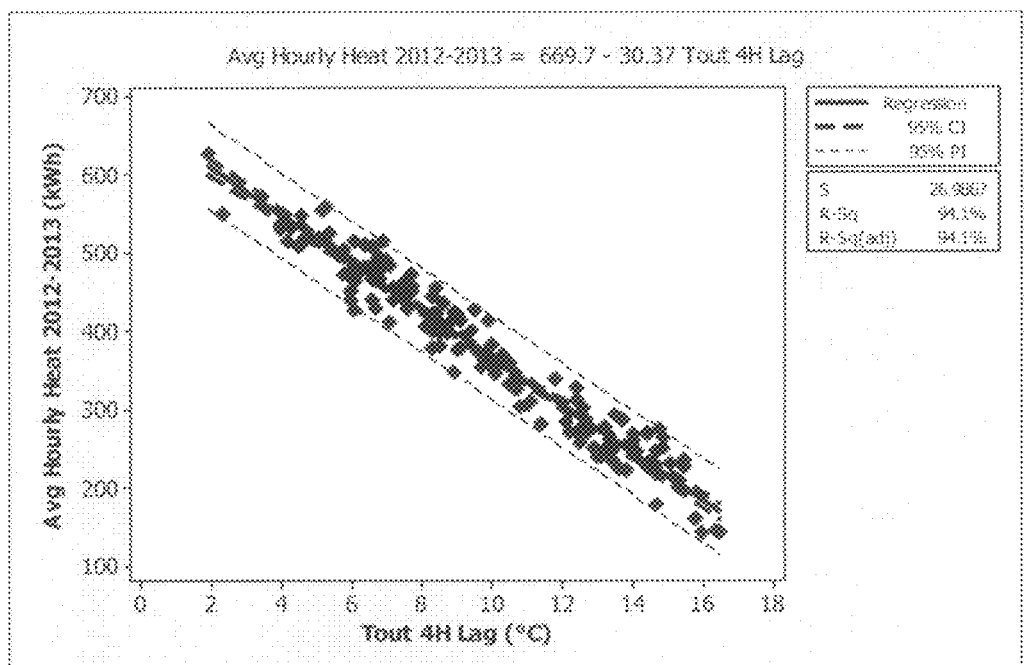
Figure 9 Simple regression relationship between the P1 heat energy and the 4 hour lagged external temperature index indicating an R-Sq of 94.1% and an RMSE (variance) of 27.0kWh.

THREE AXIS MAGNETIC SENSOR DEVICE AND METHOD USING FLEX CABLES

RELATED APPLICATIONS

This application is a continuation in part of U.S. application Ser. No. 13/906,822 by the same inventor, entitled Continuous Optimization Energy Reduction Process in Commercial Buildings, filed May 31, 2013. The entirety of application Ser. No. 13/906,822 is incorporated by reference as if fully set forth herein.

This application is also related to U.S. application Ser. Nos. 14/607,003 and 14/607,011, each by the same inventor and each a continuation in part of U.S. Ser. No. 13/906,822, and where the entireties of each of U.S. Ser. No. 14/607,003 and U.S. Ser. No. 14/607,011 are incorporated by reference as if fully set forth herein.

GOVERNMENT FUNDING

None

FIELD OF USE

The invention is useful in energy management, and more particularly in the field of energy management in commercial buildings.

BACKGROUND

Energy use analysis in commercial buildings has been performed for many years by a number of software simulation tools which seek to predict the comfort levels of buildings while estimating the energy use. The underlying principles of these tools concentrate on the building itself and the desire to keep that building at a particular level of warmth and/or humidity.

Occupant comfort is assumed to be serviced based on generalized set of parameters and tables used by designers in specifying the building and plant within it. It has been shown over several years that the predictive strength of these tools is not strong when comparing the design estimates of energy use with the reality, post-occupation. It is important that simple tools are developed to help operations and facilities staff to more easily measure, monitor and manage energy usage in their buildings. This method has been developed in an effort to facilitate the determination of an important and unique whole-building thermal property called the natural thermal lag. The method seeks to only use data which is readily available in buildings today.

BRIEF SUMMARY OF THE INVENTION

Following U.S. Ser. No. 13/906,822, where the derivation of a building's natural thermal lag (NTL) was explained, the following is an explanation of how this NTL may be derived from energy data alone. In U.S. Ser. No. 13/906,822, the NTL was determined by comparing internal space temperature and the corresponding external temperature. It will be shown in the explanation below that the energy usage in a building is dependent upon the NTL and therefore if the 15 minute interval energy usage data is known, along with the external temperature, the NTL can be determined without reference to any internal temperature data.

This is very useful since utility companies usually have this interval data for commercial buildings. It is unusual to find an accurate recording of one year of internal space temperatures for any building. Given the importance of the NTL in finding an accurate predictor of energy usage, this more accessible and simpler method is an improvement on the NTL derivation method explained in U.S. Ser. No. 13/906,822.

BRIEF DESCRIPTION OF DRAWINGS

The drawings listed are provided as an aid to understanding the invention

FIG. 9 shows Simple regression relationship between the P1 heat energy and the 4 hour lagged external temperature index indicating an R-Sq of 94.1% and an RMSE (variance) of 27.0 kWh.

DETAILED DESCRIPTION OF A PREFERRED EMBODIMENT OF THE INVENTION

Introduction

Following U.S. Ser. No. 13/906,822, where the derivation of a building's natural thermal lag (NTL) was explained, the following is an explanation of how this NTL may be derived from energy data alone. In U.S. Ser. No. 13/906,822, the NTL was determined by comparing internal space temperature and the corresponding external temperature. It will be shown in the explanation below that the energy usage in a building is dependent upon the NTL and therefore if the 15 minute interval energy usage data is known, along with the external temperature, the NTL can be determined without reference to any internal temperature data.

This is very useful since utility companies usually have this interval data for commercial buildings. It is unusual to find an accurate recording of one year of internal space temperatures for any building. Given the importance of the NTL in finding an accurate predictor of energy usage, this more accessible and simpler method is an improvement on the NTL derivation method explained in U.S. Ser. No. 13/906,822.

Determination of NTL by Regression Analysis of Energy Usage and External Temperature For any given building, the method for determining the unique NTL values over a full year has been shown in U.S. Ser. No. 13/906,822—Claim 1. This provides the theoretical background as to the existence of a unique NTL for each building with its unique plant configurations, etc. This analysis required a full year of 15 minute interval data for both internal space temperatures and external temperatures. The internal space temperatures in 15 minutes intervals can often be difficult to source from buildings where this data is not permanently logged.

Consider buildings where space heating is not required over the summer and winter cooling is required only to compensate for overheating of certain areas (poorly controlled areas). It is known from practical experience that this winter cooling load tends to be approximately constant. Since there is no need to forecast constant usage, only the variable parts of total energy usage are of interest. The total building energy usage comprising winter heating and summer cooling can be therefore split into two parts for this analysis.

The example shown in FIG. 1 shows the variation of NTL with the changing external temperature over a full year. These values of NTL for any given external temperature provide guidance as to the appropriate lag to apply in forming the lagged external temperature index. This lagged external temperature index yields the strongest predictor of energy usage in a single linear regression analysis. From FIG. 1, the strongest predictor of thermal energy usage during the winter months is likely to be the 4 hour lagged external temperature index (16 lags). Likewise, for the summer, the strongest predictor of cooling energy is likely to be the 6 hour lagged external temperature index (24 lags).

Figure 1A:
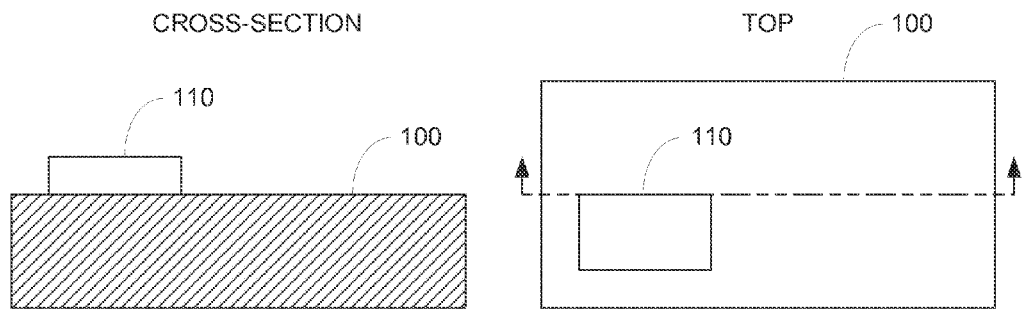
FIG. 1 shows P1 average external temperature To (line) and the corresponding NTL values (dots) July 2012 to August 2013
Figure 1B:
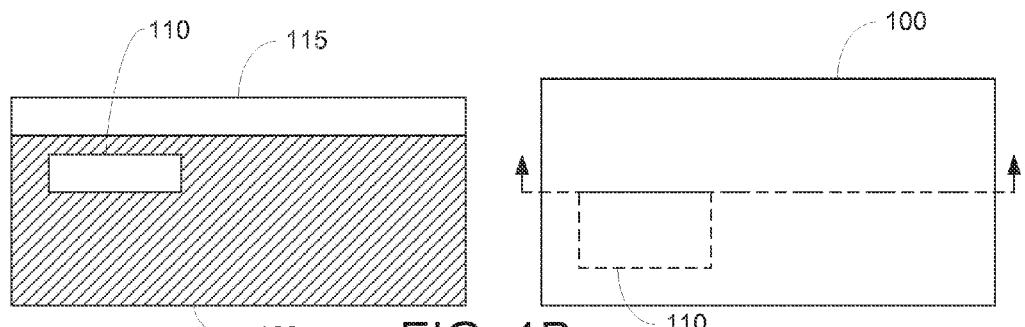
Figure 1C:
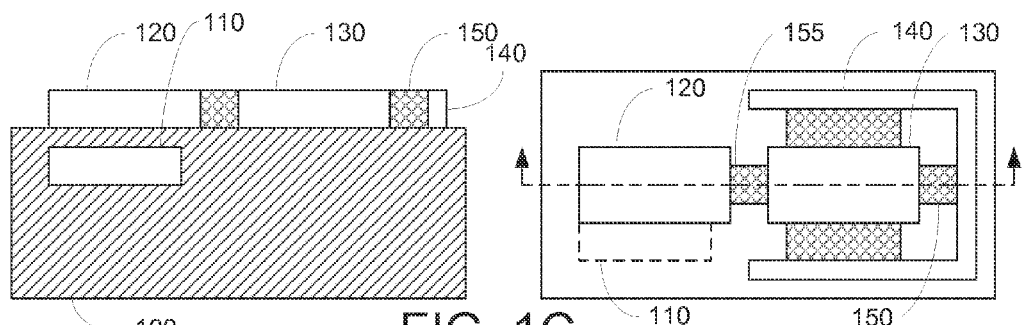
Figure 1D:
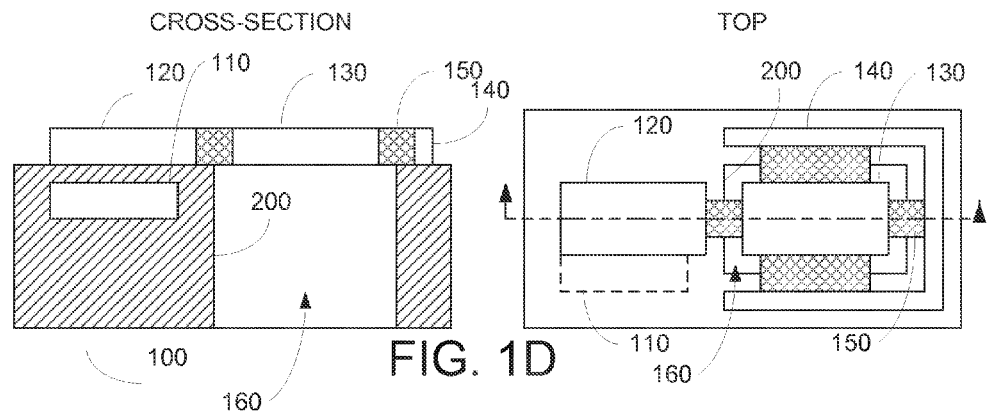
Figure 1E:
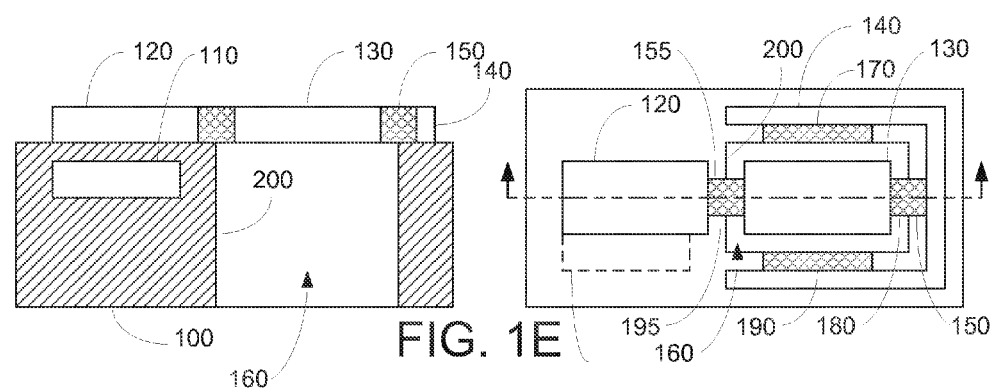
Figure 1F:
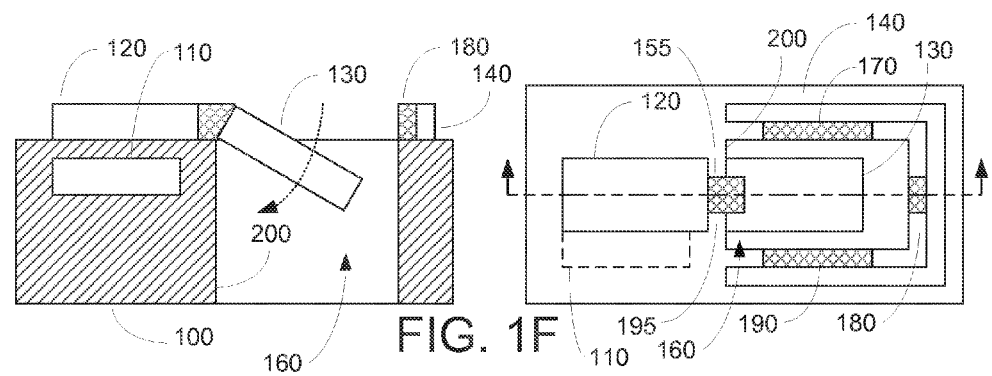
Figure 1G:
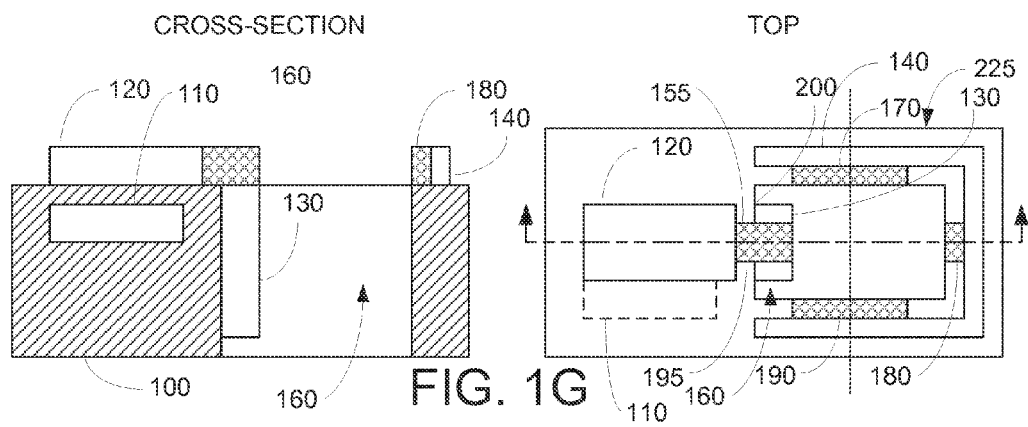
Figure 1H:
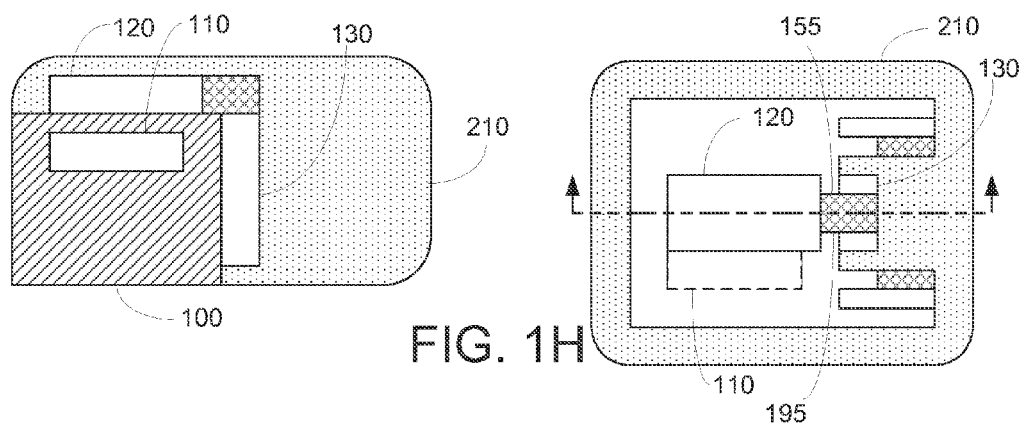
Figure 2A:
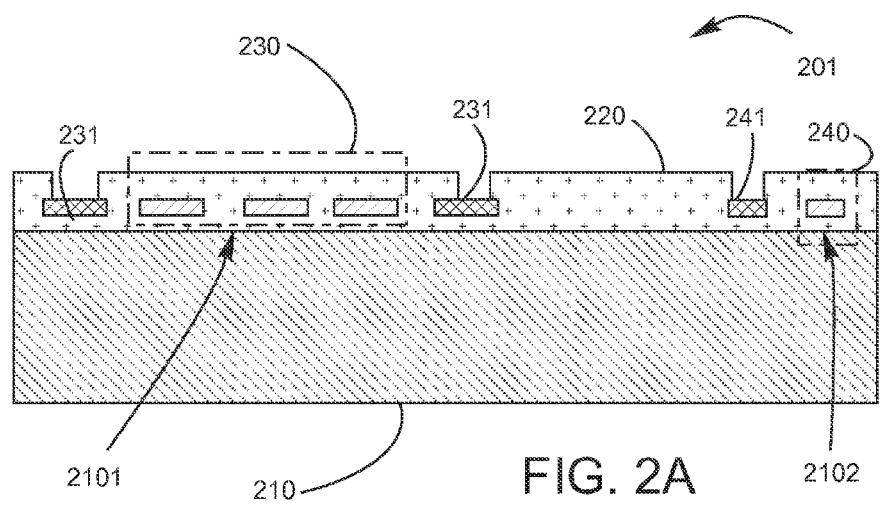
FIG. 2 shows Table 1 Single linear regression of P1 heat energy versus 0 to 8 hour lagged external temperature indices with corresponding values of R-Sq, Variance (RMSE) and the coefficient of Variation of RMSE
Figure 2B:
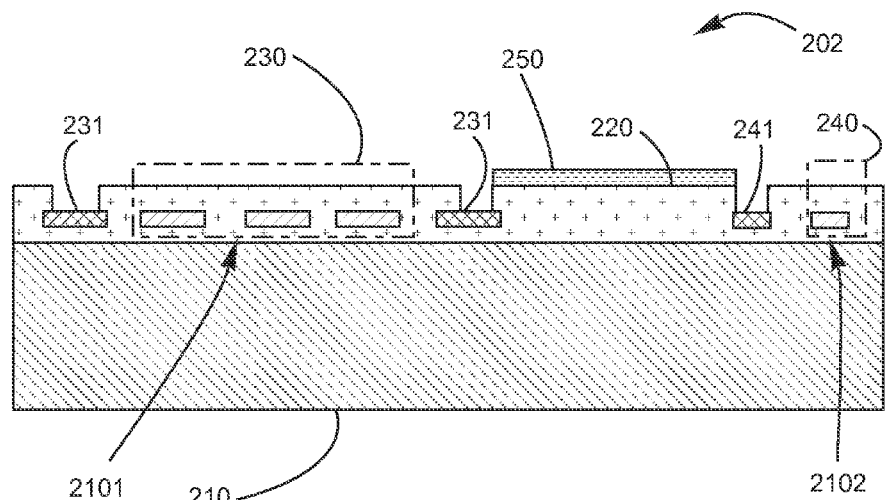
Figure 2C:
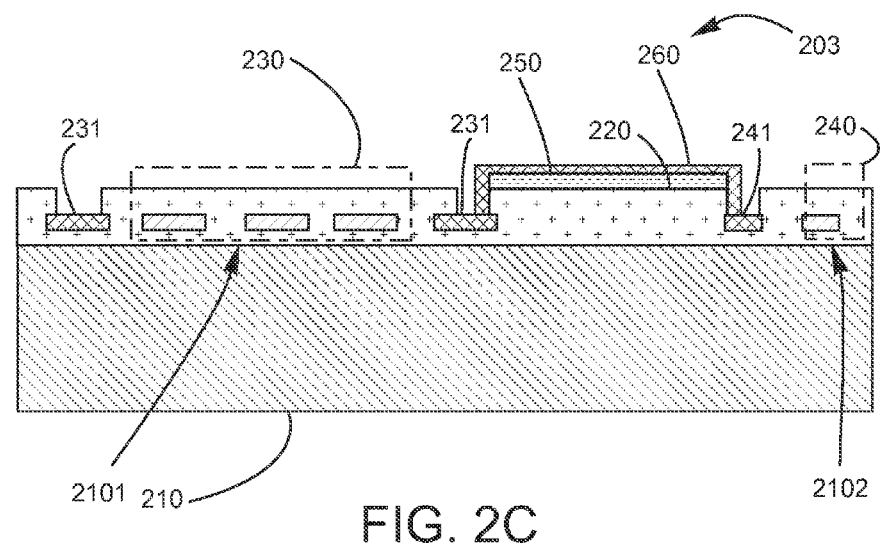
Figure 2D:
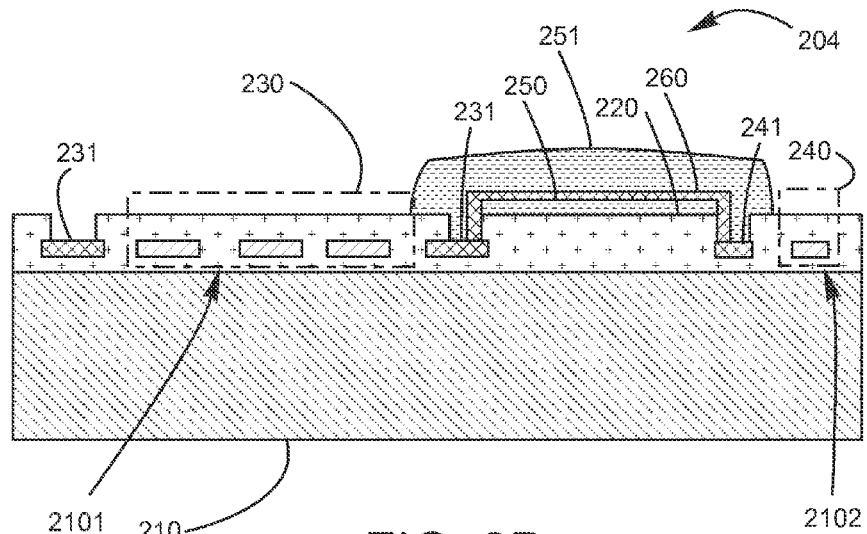
Figure 2E:
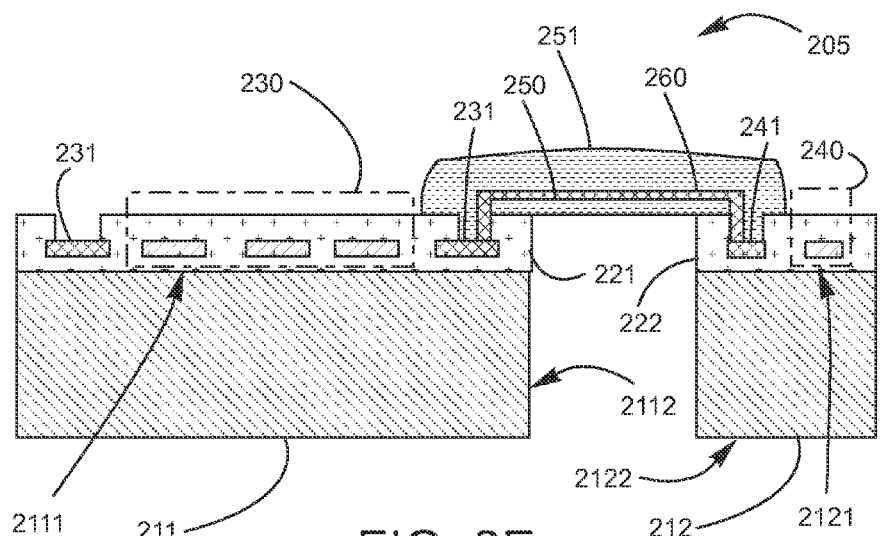
Figures 3A, 3B:
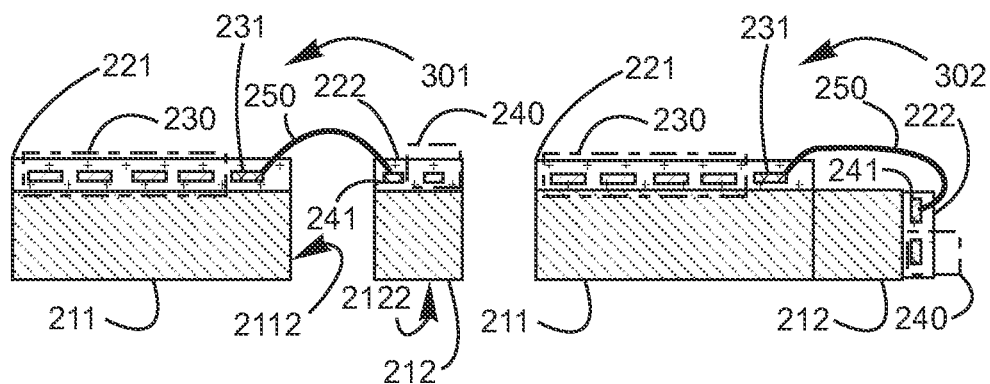
FIG. 3 shows Table 2 Single linear regression of P1 cooling energy versus 0 to 8 hour lagged external temperature indices with corresponding values of R-Sq, Variance (RMSE) and the coefficient of Variation of RMSE
Figures 3C, 3D:
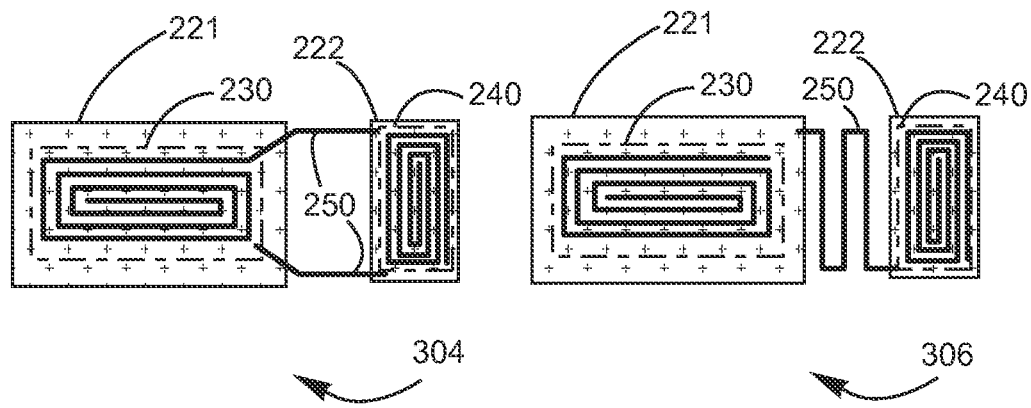

To demonstrate an alternative method to show this, a range of lagged external temperature indices is generated as shown in FIGS. 2 and 3. These indices of external temperature are simply averages formed over the period shown in row 1 of FIGS. 2 and 3. Each of these indices, in turn, is regressed against the same average hourly energy usage (heating or cooling, as appropriate). The highest value of the coefficient of determination (R-Sq) and the lowest value of variance (or Root Mean Square Error (RMSE)) coincide with the appropriate NTL value observed in FIG. 1. This has been done on three buildings of widely different usage and occupancy requirements and these buildings are referred to as P1, T1 and T2 in the following charts.

In relating average hourly energy usage (thermal and electricity) to various lagged external temperature averages, the general form of equation applied to each of these three buildings is:

$$E_i = \beta_0 + \beta_1 (LT_i)_{k=0 \ldots 8} + \epsilon_i \quad \text{Eqn 1}$$

where $E_i$ represents the observed variable of average hourly thermal of electrical energy usage for said building on any chosen day, $\beta_0$ represents the intercept of the linear relationship between energy and the lagged temperature average on the y or energy axis, $\beta_i$ represents the slope of the relationship between average hourly energy usage and the lagged temperature average $(LT_i)_{k=0 \ldots 8}$ for a same given day i and ranging over a period k from 0 to 8 hours prior to the building closing time, $\epsilon$ represents the error inherent in the linear model.

A typical regression relationship between the thermal energy used in P1 and, as an example, the predictor variable of the 4 hour lagged external temperature index is shown in FIG. 9. The regression model shown at the top of FIG. 9 is consistent with the generalized statistical model in Eqn 1. It is evident from FIG. 2 that the highest value of R-Sq and lowest values of RMSE and the Coefficient of Variation of RMSE (CV(RMSE)) occur at the 4 hour lagged external temperature index for heating in P1. This is in agreement with the derivation of the NTL in U.S. Ser. No. 13/906,822 Claim 1. The same can be shown for this P1 building with an analysis of cooling energy over the summer and this is shown in FIG. 3.

Again, it can be observed from FIG. 3 that the single linear regression model with the highest R-Sq, and lowest values of RMSE and CV(RMSE) correspond to the NTL value as guided by the method in U.S. Ser. No. 13/906,822 Claim 1, in this case of P1 cooling, 6 hours.

This provides a method to determine the NTL without having to know any internal space temperatures.

Figures 4A, 4B:
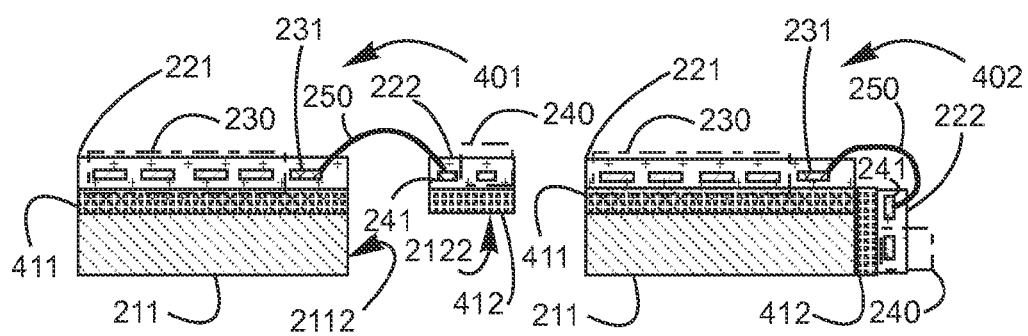
FIG. 4 shows External temperature (dotted), internal space temperature in P1 while the building is at rest (solid) and the desired space temperature set-point (dashed)
Figures 4C, 4D:
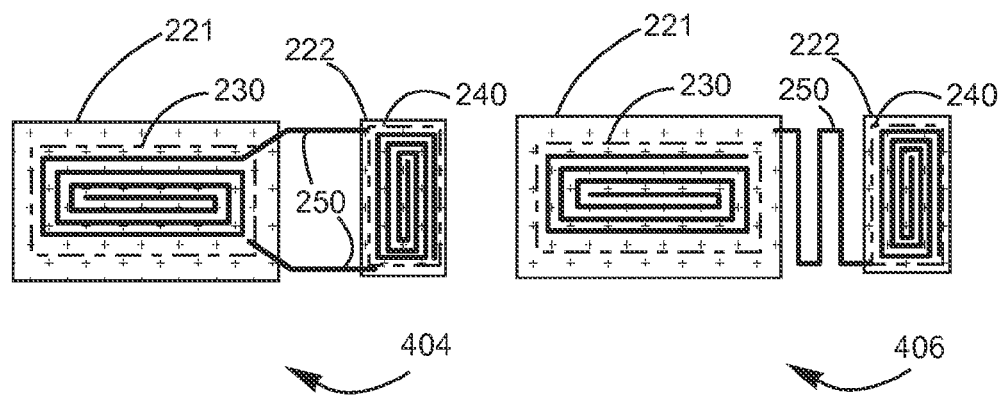

In order to illustrate why this should be the case, consider the following data provided in FIG. 4 which shows the desired space temperature set-point (based on Occupant Comfort standards) and the internal and external temperature profiles for a typical day (while the building is at rest).

The amount of thermal energy required to bring the internal space to the desired set-point can be represented by the hatched area. The amount of energy required can be observed to depend on the level of internal temperature during the working day which in turn has been shown to depend on the external temperature which has occurred at some time in the past.

An approximation of how long in the past is provided by the NTL. The effects of the rising external temperature can be observed to influence the required thermal energy to reach set-point. Unlike P1, which is of heavy construction with a high thermal mass, a building of lightweight steel frame construction is likely to respond faster, and in a more pronounced manner, to changes in outside temperature, and therefore have a lower NTL.

In order to test the results from building P1, the process was repeated on the first test (T1) building. This building is a multi-tenant mixed use building of office and retail. The construction technique is of steel frame with lightweight curtain walling and glazing. It is expected that the T1 building is lighter when compared to P1 and therefore should exhibit a smaller NTL value in both winter and summer given the thermal losses will be higher.

The method outlined in U.S. Ser. No. 13/906,822 was implemented for T1 and the year-round NTL was determined as shown in FIG. 5.

Figure 7:
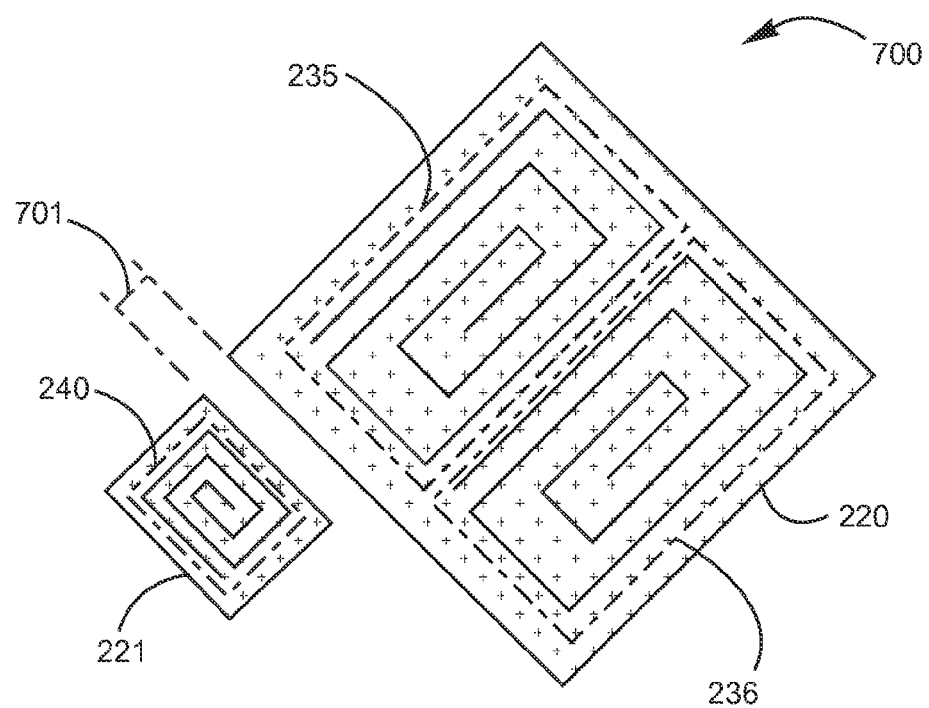
FIG. 7 shows Table 4 T1 cooling energy regressed against each of the lagged external temperature indices (8 hours to 0 hours) and the R-Sq, RMSE and CV(RMSE) results, with the best result highlighted

The values indicate a winter NTL of between 2 and 4 lag periods or between 1 and 0 hours and a summer NTL of approximately 12 lag periods or 3 hours. As with the P1 building, the various lagged average external temperatures were generated going back 8 hours and the heating and cooling energy usage figures were regressed each lagged temperature average in turn. The results of these regressions are shown in FIG. 6 and FIG. 7.

If the hypothesis developed for building P1 is borne out, it would be expected that the heating NTL for T1 would be at or near the 0 hour lagged temperature index, which is where it is, given the highest R-Sq and lowest CV(RMSE).

Figures 5A, 5B:
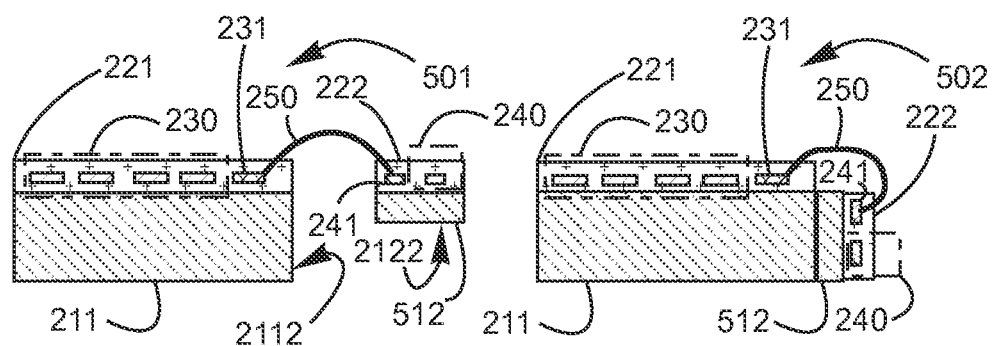
FIG. 5 shows T1 average temperatures (line) versus lag period count (dots) from Sep. 1, 2012 to Aug. 18, 2013
Figures 5C, 5D:
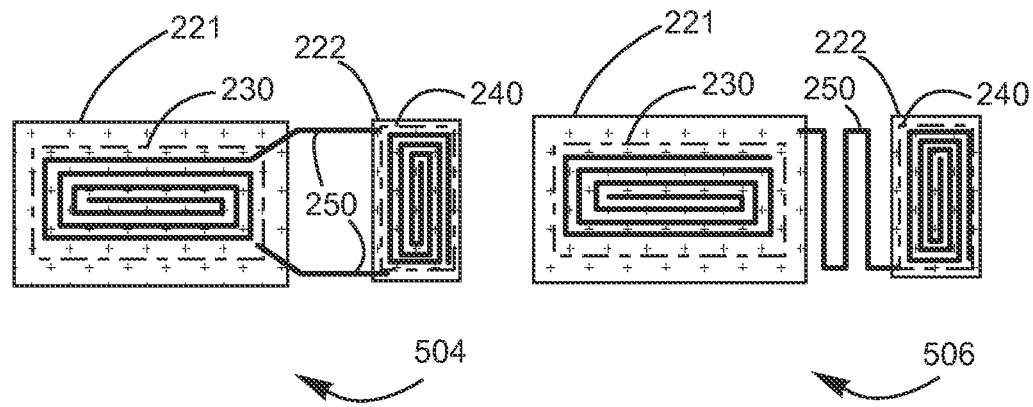
Figure 6A:
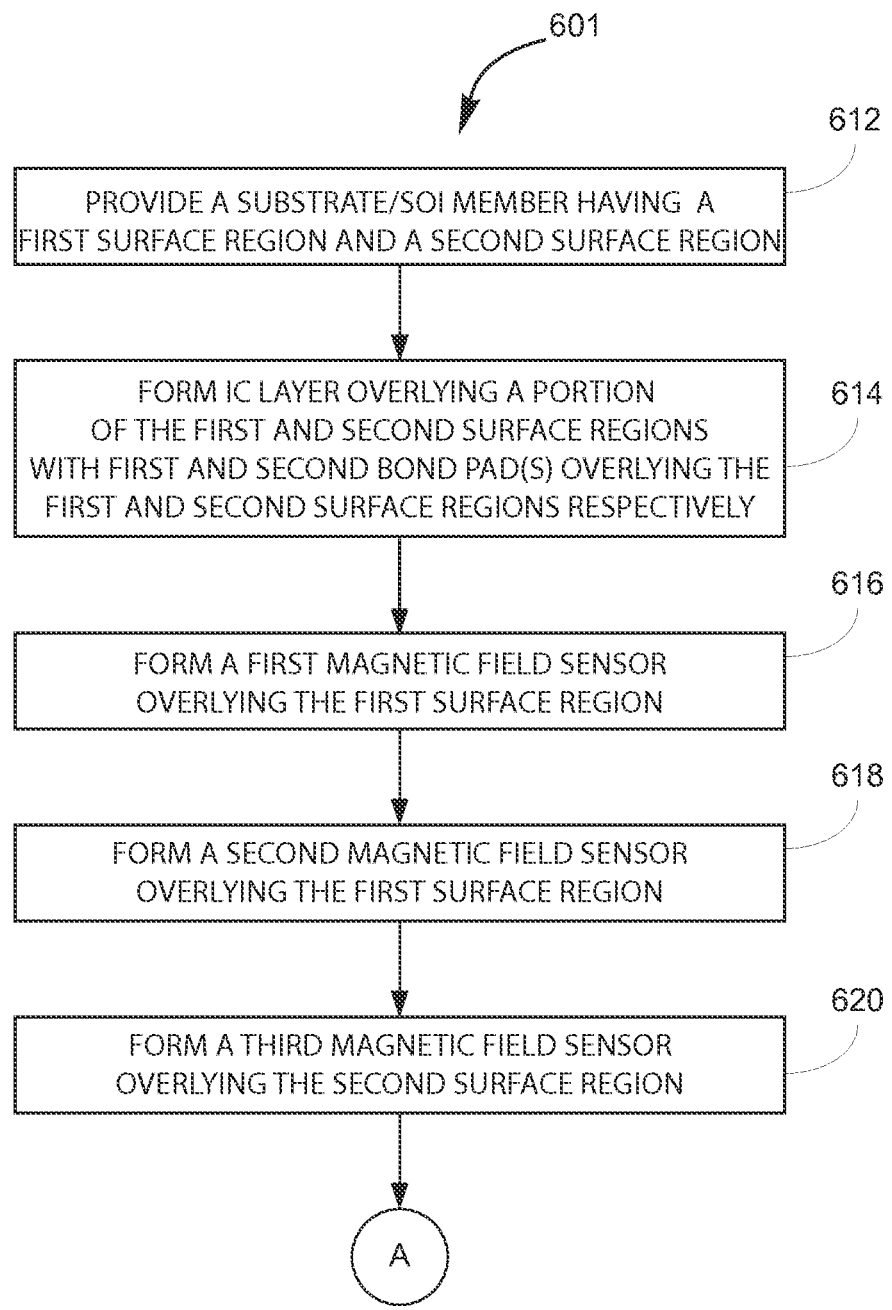
FIG. 6 shows Table 3 T1 heat energy regressed against each of the lagged external temperature indices (8 hours to 0 hours) and the R-Sq, RMSE and CV(RMSE) results, with the best result highlighted
Figure 6B:
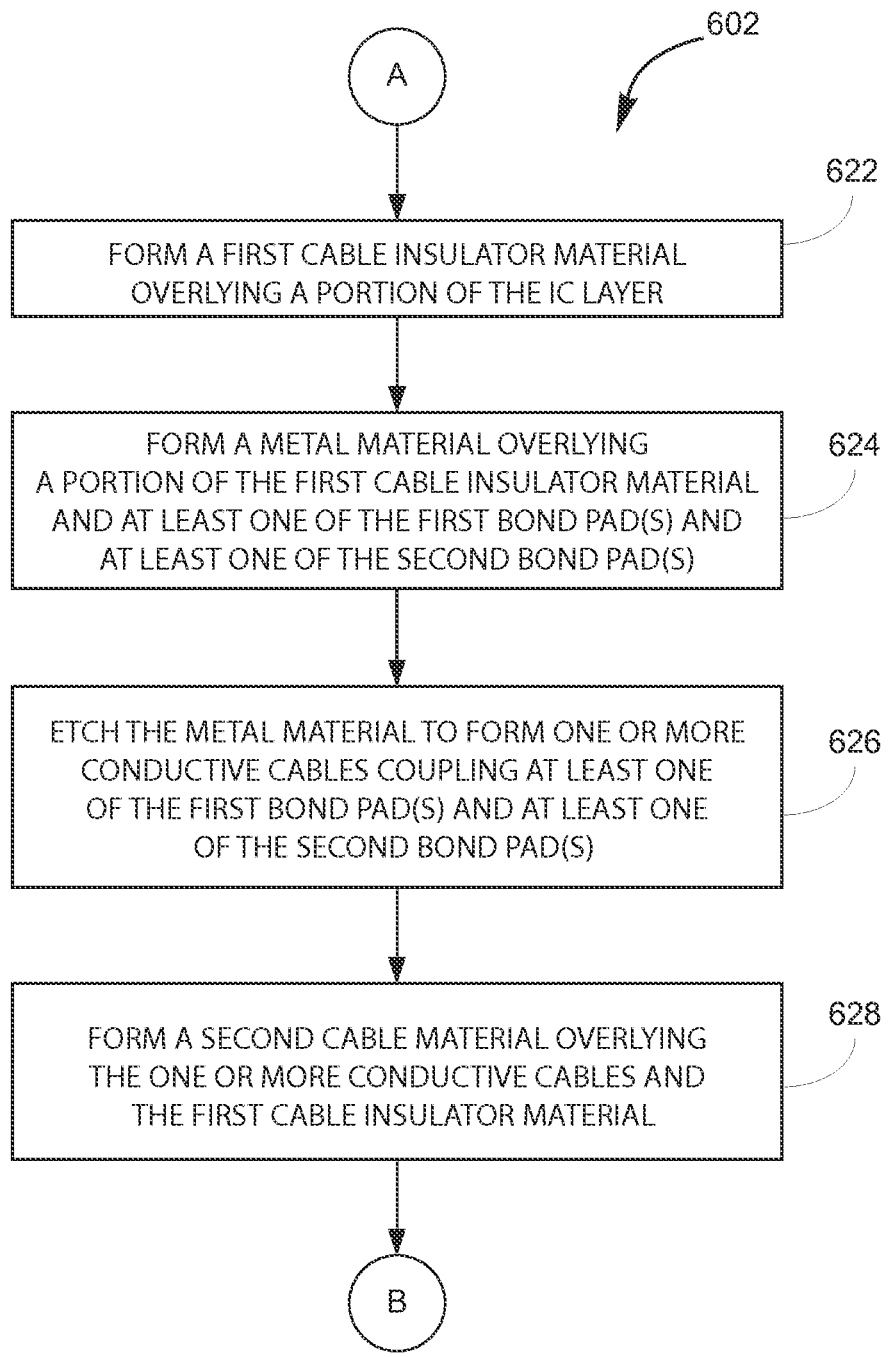
Figure 6C:
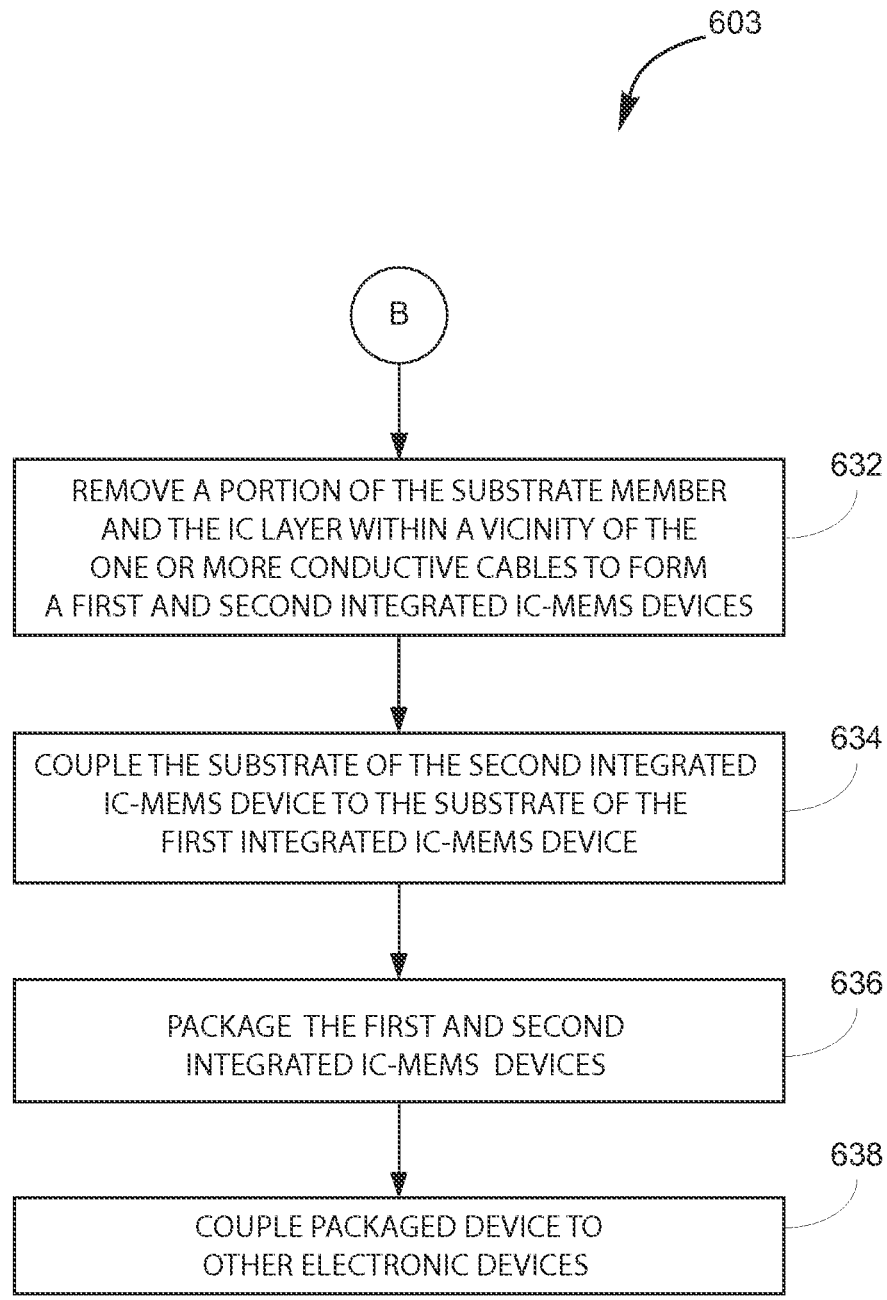
Figure 6D:
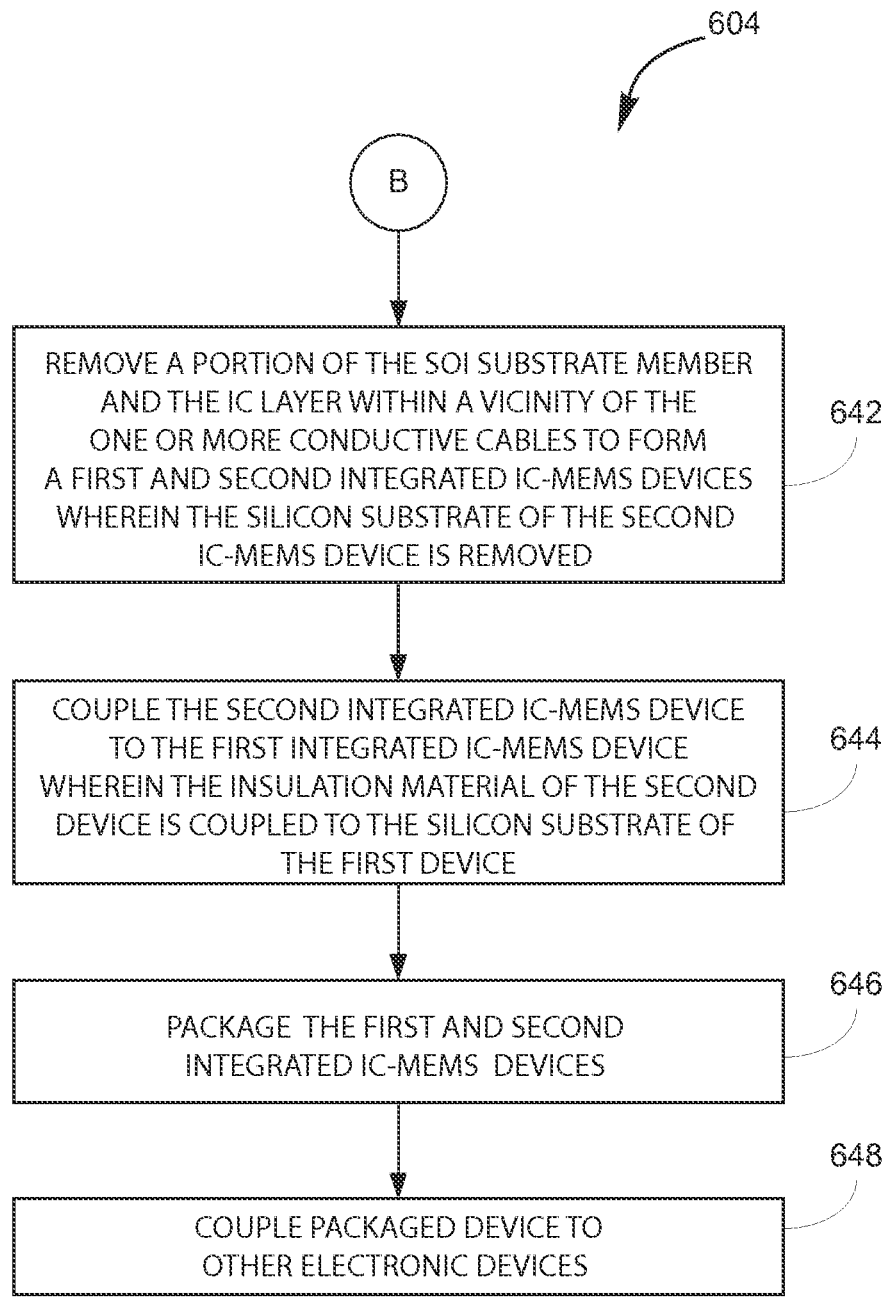

Again, for the cooling energy data, the best model with the highest R-Sq and lowest CV(RMSE) coincides with the NTL calculated and plotted in FIG. 5.

These results show that the heating and cooling energy usage in T1 are directly related to the calculated NTL and the particular NTL for winter and summer, can be determined by examination of the thermal and electrical cooling energy usage figures alone.

Figure 8:
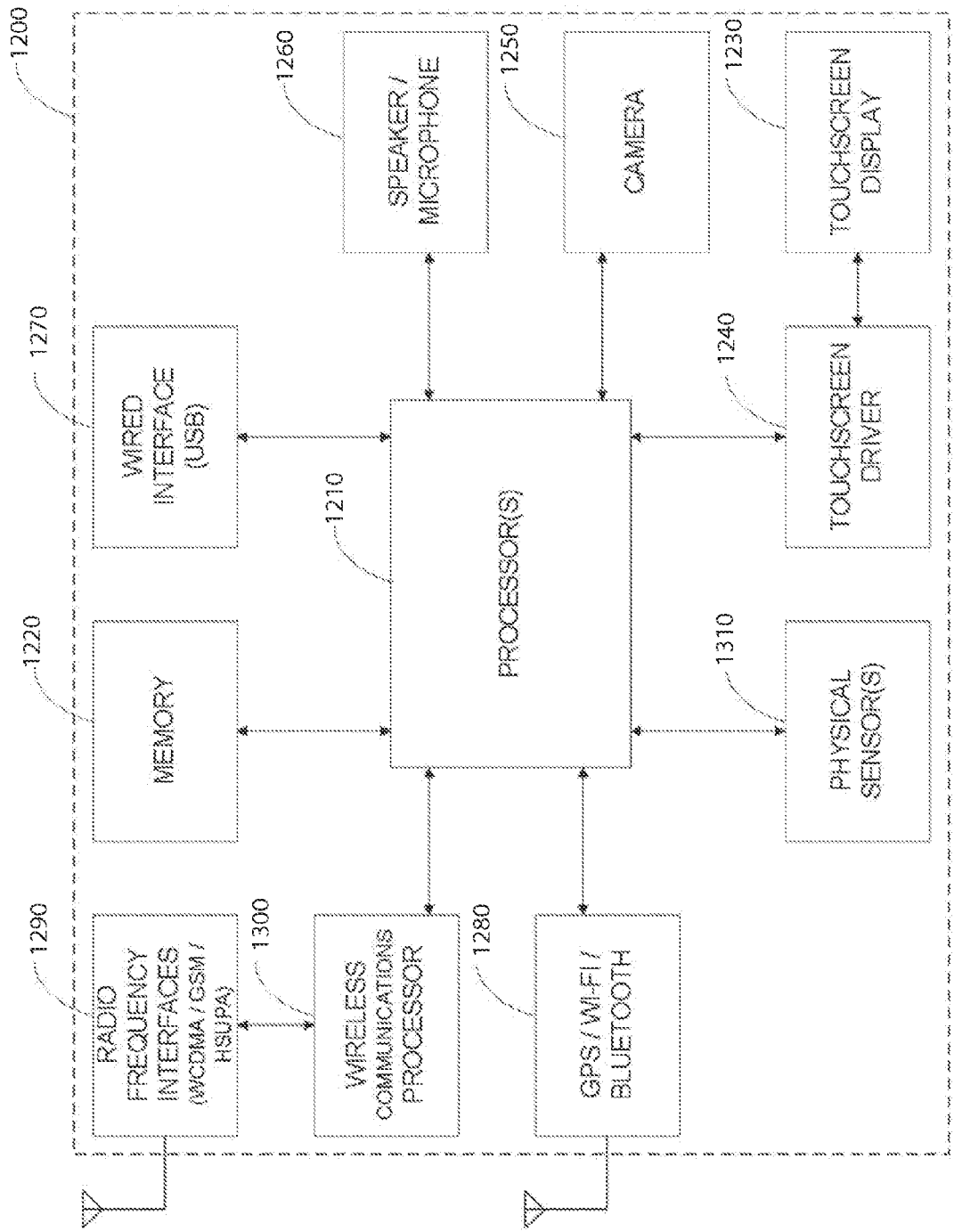
FIG. 8 shows Table 5 T2 cooling energy regressed against each of the lagged external temperature indices (8 hours to 0 hours) and the R-Sq, RMSE and CV(RMSE) results, with the best result highlighted

Finally, the process was repeated on data from the test building T2. T2 is of similar construction as T1, being in the same development. The building is an enclosed shopping mall and the landlord's supply of cooling was examined. Landlord's heating is seldom required given occupancy levels and residual heat from the retail units. The following results were observed:

The T1 NTL was determined by the method outlined in U.S. Ser. No. 13/906,822 and was shown to be under one hour throughout the year given the high percentage of roof glazing. With this value, it would be expected that the 0 hour lagged external temperature would provide the strongest predictor of cooling energy usage. The various lagged external temperature indices were generated and regressed against the cooling energy usage. The results are outlined in FIG. 8.

The strongest model was again found when the o hour lagged temperature index was used to predict cooling energy usage. This coincides with the data presented in U.S. Ser. No. 13/906,822 for the T2 building.

An improved method of determining a building's unique NTL values for the heating and cooling seasons has been developed for a pilot building P1. This improved method has been applied to two test buildings, T1 and T2, to determine if the method can be accurately applied to determine the NTL values. In all three cases, the NTL values determined with the method developed in U.S. Ser. No. 13/906,822 was confirmed by the new and improved method.

In all three cases, the improved method only uses the 15-minute interval energy usage data and the 15-minute interval external temperature data. This data is readily available from existing buildings, thereby making the improved method more useful in the determination of this important building thermal characteristic.

Summing up. The invention provides an improved method of determining the natural thermal lag of a building, where said method includes the steps of collecting and analysing building energy data and local external temperature.

Using a processor for calculating, over a predetermined set of time increments, a series of up to nine statistical relationships between average hourly energy usage and nine lagged average temperature indices for said building. The nine regression relationships are averaged external temperatures over the working day with each index stepping back one hour in time.

According to the invention, the natural thermal lag can be derived by examination of the relationship between energy usage and external temperature for said building. The relationship is described by the following equation:

$$E_i = \beta_0 + \beta_1 (LT_i)_{k=0\ldots8} + \epsilon_i \qquad \text{Eqn 1}$$

where
$E_i$ represents the observed variable of average hourly thermal of electrical energy usage for said building on any chosen day,
$\beta_0$ represents the intercept of the linear relationship between energy and the lagged temperature average on the y or energy axis,
$\beta_1$ represents the slope of the relationship between average hourly energy usage and the lagged temperature average $(LT_i)_{k=0\ldots8}$ for a same given day i and ranging over a period k from 0 to 8 hours prior to the building closing time,
$\epsilon$ represents the error inherent in the linear model.

The results of this series of regressions are shown in FIG. 2 for sample building P1. For any given building, the unique value of natural thermal lag (NTL) during the heating and cooling seasons, determined separately, can be determined by single linear regression of daily energy usage against the lagged average external temperature index which yields the most predictive regression model. Many buildings are heated by gas or oil and cooled by electricity and therefore the type of energy regressed against external temperature is dictated by the season under review.

This is an improvement over U.S. Ser. No. 13/906,822 in that the said building's internal temperature interval data is no longer required and the NTL can be determine by use of readily available data from said building.

What is claimed is:

1. A device for sensing magnetic fields, the device comprising:
   a first substrate member having a first surface region and a second surface region
   a first integrated circuit (IC) layer spatially disposed overlying at least a portion of the first surface region of the first substrate member, the first IC layer having one or more bond pads;
   a first magnetic field sensor element operably coupled to the first IC layer, the first magnetic field sensor element being configured to sense magnetic fields in a first spatial direction;
   a second magnetic field sensor element operably coupled to the first IC layer, the second magnetic field sensing element being configured to sense magnetic fields in a second direction;
   a second substrate member coupled to the first substrate member, the second substrate member having a first surface region and a second surface region, the second surface region of the second substrate member being coupled to the second surface region of the first substrate member;
   a second IC layer spatially disposed overlying at least a portion of the first surface region of the second substrate member, the second IC layer having one or more bond pads;
   a third magnetic field sensor element operably coupled to the second IC layer, the third magnetic sensing element being configured to sense magnetic fields in a third spatial direction; and
   one or more conductive elements electrically coupling the first IC layer and the second IC layer, the one or more conductive elements being coupled to the bond pad of the first IC layer and the bond pad of the second IC layer.

2. The device of claim 1 wherein the one or more conductive elements are selected from a group of materials consisting of: metals or metal alloys.

3. The device of claim 1 wherein the first substrate member and the second substrate member both comprise materials from a monolithic silicon substrate.

4. The device of claim 1 wherein the one or more conductive elements comprise a passivation or parylene material.

5. The device of claim 1 wherein the second surface region of the second substrate member is coupled to the second surface region of the first substrate member via a material selected from a group consisting of: an adhesive material, a glue material.

6. The device of claim 1
   wherein the first, second, and third magnetic field sensor elements are devices selected from a group consisting of: anisotropic magneto-resistive (AMR) devices, giant magneto-resistive (GMR) devices, or tunnel junction magneto-resistive (TMR) devices, and
   wherein the first spatial direction, the second spatial direction and the third spatial direction are orthogonal.

7. The device of claim 1 wherein the first magnetic field sensor element is configured to detect magnetic fields in the first spatial direction via being disposed in a first spatial orientation overlying the first surface region, the second magnetic field sensor element is configured to detect magnetic fields in the second spatial direction via being disposed in a second spatial orientation overlying the first surface region, and the third magnetic field sensor element is configured to detect magnetic fields in the third spatial direction via a vertically mounted orientation.

8. The device of claim 1
wherein the first surface region of the first substrate member comprises a horizontal surface and wherein the second surface region of the first substrate member comprises a vertical surface; and
wherein the first surface region of the second substrate member comprises a top surface and wherein the second surface region of the second substrate member comprises a bottom surface.

9. A device for sensing magnetic fields, the device comprising:
a substrate member having a first surface region and a second surface region;
a first insulation material spatially disposed overlying the first surface region of the substrate, the first insulation material having a surface region;
a first integrated circuit (IC) layer spatially disposed overlying at least a portion of the surface region of the first insulation material, the first IC layer having one or more bond pads;
a first magnetic field sensor element operably coupled to the first IC layer, the first magnetic field sensor element being configured to detect at least in a first direction;
a second magnetic field sensor element operably coupled to the first IC layer, the second magnetic field sensing element being configured to detect at least in a second direction;
a second insulation material coupled the substrate member, the second insulation material having a first surface region and a second surface region, the second surface region of the second insulation material being coupled to the second surface region of the substrate member;
a second IC layer spatially disposed overlying at least a portion of the first surface region of the second insulator material, the second IC layer having one or more bond pads;
a third magnetic field sensor element operably coupled to the second IC layer, the third magnetic sensing element being configured to detect at least in a third direction; and
one or more conductive cables electrically coupling the first IC layer and the second IC layer, the one or more conductive cables being coupled to at least one of the bond pad(s) of the first IC layer and at least one of the bond pad(s) from the second IC layer.

10. The device of claim 9 wherein the one or more conductive cables comprises metals or metal alloys.

11. The device of claim 9 wherein the one or more conductive cables is coated with a passivation material or a parylene material.

12. The device of claim 9 wherein the substrate member, the first insulation material, and the second insulation material comprise materials from a monolithic silicon-on-insulator member.

13. The device of claim 9 wherein the second surface region of the second insulation material is coupled to the second surface region of the substrate member via a material selected from a group consisting of: an adhesive material, a glue material.

14. The device of claim 9 wherein the first, second, and third magnetic field sensor elements are devices selected from a group consisting of: comprise anisotropic magneto-resistive (AMR) devices, giant magneto-resistive (GMR) devices, or tunnel-junction magneto-resistive (TMR) devices.

15. The device of claim 9 wherein the first magnetic field sensor element is configured to detect magnetic fields in the first spatial direction via being disposed in a first spatial orientation overlying the first surface region, the second magnetic field sensor element is configured to detect magnetic fields in the second spatial direction via being disposed in a second spatial orientation overlying the first surface region, and the third magnetic field sensor element is configured to detect magnetic fields in the third spatial direction via a vertically mounted orientation.

16. The device of claim 9
wherein the first surface region of the substrate member comprises a horizontal surface and wherein the second surface region of the substrate member comprises a vertical surface; and
wherein the first surface region of the second insulation material comprises a top surface and wherein the second surface region of the second insulation material comprises a bottom surface.

17. A device for sensing magnetic fields, the device comprising:
a first substrate member having a first surface region and a second surface region, the second surface region being perpendicular to the first surface region;
a first integrated circuit (IC) layer spatially disposed on at least a portion of the first surface region of the first substrate member, the first IC layer having one or more bond pads;
a first magnetic field sensor element disposed on the first surface region of the first substrate member and operably coupled to the first IC layer, the first magnetic field sensor element being configured to sense magnetic fields in a first spatial direction;
a second magnetic field sensor element operably coupled to the first IC layer, the second magnetic field sensing element being configured to sense magnetic fields in a second direction;
a second substrate member coupled to the first substrate member, the second substrate member having a first surface region and a second surface region, the second surface region being parallel to the first surface region, the second surface region of the second substrate member being coupled to the second surface region of the first substrate member, such that the first surface of the second substrate member is perpendicular to the first surface of the first substrate member;
a second IC layer spatially disposed overlying at least a portion of the first surface region of the second substrate member, the second IC layer having one or more bond pads;
a third magnetic field sensor element disposed on the first surface region of the second substrate member and operably coupled to the second IC layer, the third magnetic sensing element being configured to sense magnetic fields in a third spatial direction; and
one or more conductive elements electrically coupling the first IC layer and the second IC layer, the one or more conductive elements being coupled to the bond pad of the first IC layer and the bond pad of the second IC layer.

18. The device of claim 17 wherein the axis of the third magnetic field sensor element is perpendicular to the axis of the first magnetic field sensor element and the axis of third magnetic field sensor element.

* * * * *